US007878008B1

(12) United States Patent
Mateski et al.

(10) Patent No.: US 7,878,008 B1
(45) Date of Patent: Feb. 1, 2011

(54) SMART RACK AND INTELLIGENT WIRELESS CLIMATE SENSORS

(75) Inventors: Christopher Joseph Mateski, Overland Park, KS (US); David Wayne Haney, Richmond, KS (US); Andrew Lee Davey, Overland Park, KS (US)

(73) Assignee: Sprint Communications Company L.P., Overland Park, KS (US)

( * ) Notice: Subject to any disclaimer, the term of this patent is extended or adjusted under 35 U.S.C. 154(b) by 584 days.

(21) Appl. No.: 11/612,084

(22) Filed: Dec. 18, 2006

(51) Int. Cl.
*G01K 13/00* (2006.01)
*F25B 49/00* (2006.01)
*G05D 23/00* (2006.01)
(52) U.S. Cl. ............... 62/129; 62/125; 62/126; 62/127; 700/276; 700/299; 700/300
(58) Field of Classification Search ............ 62/129, 62/127, 125, 126; 236/51; 700/276, 299, 700/300
See application file for complete search history.

(56) References Cited

U.S. PATENT DOCUMENTS 7,313,461 B2 * 12/2007 Sharma et al. .............. 700/245

2003/0037554 A1 * 2/2003 Gatling et al. ............... 62/156
2005/0024826 A1 * 2/2005 Bash et al. ................... 361/695
2005/0173549 A1 * 8/2005 Bash et al. ................... 236/51
2007/0067063 A1 * 3/2007 Ahmed ........................ 700/275

OTHER PUBLICATIONS

Data Center Management [online] [retreived on Oct. 18, 2006]. Retrieved from the Internet:<http://www.cyclades.com/solutions/technology.php>.
SeverTech EMCU-1 Monitoring Solutions [online] [retrieved on Oct. 18, 2006]. Retrieved from the Internet:<http://www.42u.com/servertech-emcu.htm>.

* cited by examiner

*Primary Examiner*—Frantz F Jules
*Assistant Examiner*—Travis Ruby (57) ABSTRACT

A smart rack having intelligent wireless climate sensors that detect and report one or more climate conditions is provided. The smart rack includes an enclosure that houses network elements and an array of intelligent wireless climate sensors that form a mesh network. The enclosure of the smart rack includes a console that displays climate measurements and notifications. The intelligent wireless climate sensors perform periodic climate measurements and detect climate conditions in the smart rack. When a climate condition is detected the console of the smart rack graphically displays the climate condition.

17 Claims, 9 Drawing Sheets

SMART RACK AND INTELLIGENT WIRELESS CLIMATE SENSORS

BACKGROUND

Conventionally, a computing environment having dense networking elements may experience network element failures after processor upgrades, storage upgrades, or any other change to the computing environment. The failures in the computing environment may be caused by faulty programming in the network element, faulty electronics in the network element, or harmful temperature conditions in the computing environment. Customers utilizing network elements in the computing environment realize the actual impact of the failures in the computing environment through degradation of one or more services provided by the network elements or complete loss of the one or more services provided by the network elements.

Conventional sensors in the dense computing environment are utilized to detect temperature conditions in the dense computing environment. The conventional sensors measure the temperature in the dense computing environment and report the temperature measurements to a conventional computing environment management system for further processing. The conventional computing environment management system utilizes the temperature measurements to generate a notification to an administrator or technician for the computing environment.

Among other shortcomings, the conventional computing environment management system does not automatically generate suggestions for correcting failures caused by the harmful temperature conditions. Additionally, the conventional computing environment management system does not graphically display failures caused by the harmful temperature conditions in an intuitive manner to the administrator or technician of the computing environment.

SUMMARY

Embodiments of the present invention are defined by the claims below. Embodiments of the present invention solve at least the above problems by providing a smart rack having intelligent wireless climate sensors and a method to, among other things, identify harmful climate conditions in the smart rack and to suggest corrective actions for the harmful climate conditions. Embodiments of the present invention have several practical applications in the technical arts including generating mesh networks for wireless climate sensors that measure climate conditions and providing reports and notifications associated with climate conditions in the smart rack.

In a first aspect, the smart rack includes computer-readable media having computer-useable instructions for a method to identify climate conditions in the smart rack having network elements. The smart rack receives the climate measurements from the intelligent wireless climate sensors. The smart rack stores the climate measurement in a rack database and processed the climate measurement to determine whether the climate measurement are within a specified range. An appropriate intuitive notification is generated in a graphical representation to inform an administrator or technician that the climate condition in the smart rack is normal or harmful. A notification that the climate condition is harmful is supplemented with suggestions that temporarily or permanently correct the harmful climate condition.

In a second aspect, the smart rack includes an array of intelligent wireless climate sensors that detect climate conditions associated with network elements in the smart rack. The smart rack includes an enclosure having one or more partitions for sections that include a subset of the network elements. Also, the enclosure includes a mounting mechanism that secures a console interface that is configured to display climate conditions associated with each partition in the smart rack.

In a third aspect, the intelligent wireless climate sensors that detect climate conditions in the smart rack include a memory, a central processing unit, a rack database, and a communication interface. The memory stores climate measurement and climate condition detection instructions. The central processing unit executes the climate measurement and detection instructions stored in the memory. The rack database logs climate measurements in the smart rack and stores thresholds associated with predetermined climate conditions. The communication interface wirelessly transmits the climate measurements to neighboring sensors within a predetermined radius.

BRIEF DESCRIPTION OF THE SEVERAL VIEWS OF THE DRAWINGS

Illustrative embodiments of the present invention are described in detail below with reference to the attached drawing figures, which are incorporated by reference herein and wherein.

DETAILED DESCRIPTION

Embodiments of the present invention provide a smart rack, intelligent wireless climate sensors, and methods to identify climate conditions in the smart rack. An array of intelligent wireless climate sensors form a mesh network that enables wireless communication among the wireless climate sensors that perform climate measurement in the smart rack. The climate measurements are utilized to provide an intuitive user interface for presenting climate conditions associated with the climate measurements. The user interface may provide reports that include, but are not limited to, network element redeployment plans, snapshots of the smart rack during specified time frames, and visual indicators associated with the current and historical climate condition in the smart rack.

As utilized herein, the term "component" refers to any combination of hardware, software, and firmware. Computer-readable media include both volatile and nonvolatile media, removable and nonremovable media, and contemplates media readable by a database, a switch, and various other network devices. Network switches, routers, and related components are conventional in nature, as are means of communicating with the same. By way of example, and not limitation, computer-readable media comprise computer-storage media and communications media.

Computer-readable media include both volatile and nonvolatile media, removable and nonremovable media, and contemplates media readable by a database, a switch, and various other network devices. Network switches, routers, and related components are conventional in nature, as are means of communicating with the same. By way of example, and not limitation, computer-readable media comprise computer-storage media and communications media.

Embodiments of the present invention provide intelligent wireless climate sensors that measure the climate in a smart rack and stores the climate measurements in a database. The database responds to queries for generating reports that illustrate current and historical climate conditions in the smart rack. The smart rack is a container in a data center that holds various computing or networking elements in a horizontal or vertical arrangement.

Figure 1:
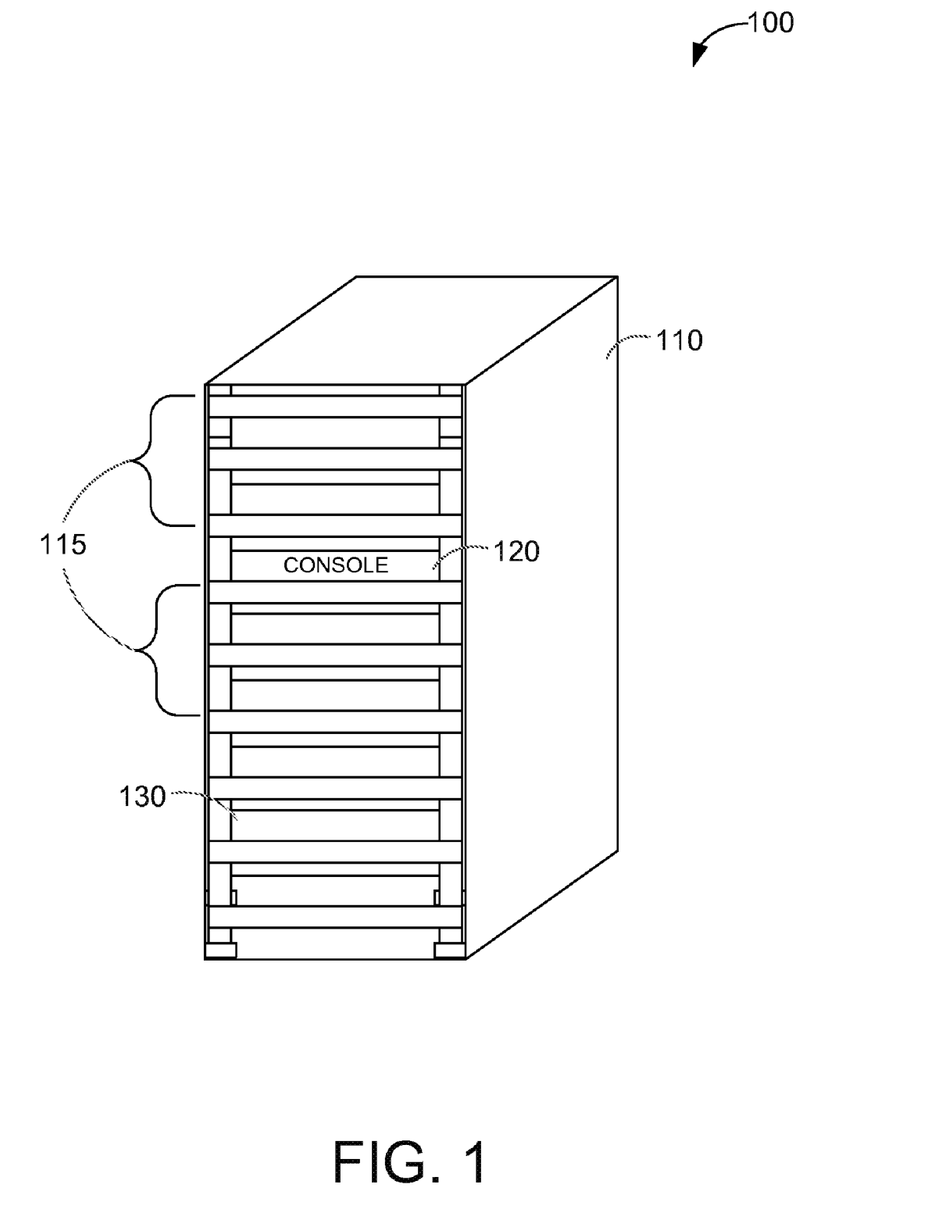
FIG. 1 is a block diagram that illustrates an exemplary smart rack, according to embodiments of the present invention.

FIG. 1 is a block diagram that illustrates an exemplary smart rack 100, according to embodiments of the present invention. The smart rack 100 includes an enclosure 110, enclosure partitions 115, a console 120, network elements 130, and arrays of intelligent wireless climate sensors (not shown).

The enclosure 110 is a casing that houses the network elements 130 and climate sensors. The enclosure 110 creates a dense concentration of the network elements that consume large quantities of power and generate heat as a by product. The enclosure 110 provides enclosure partitions 115 that arrange the network elements in a vertical or horizontal orientation.

The enclosure partitions 115 creates sections in the smart rack 100 that house the network elements 130. The sections may include one or more network elements 130 depending on the size of the network elements 130. In some embodiments, the enclosure partitions 115 are adjustable and may accommodate network elements 130 in vertical and horizontal arrangements.

The console 120 is a user interface that provides indicators associated with the climate condition in the smart rack 100. The console 120 may provide the climate condition for each section in the smart rack 100. The console 120 may also display normal and alarm notifications associated with each section in the smart rack 100. The console 120 may be integrated on the surface of the enclosure 110. In an alternate embodiment, the console 120 is provided by a mobile device, such as a personal digital assistant, mobile phone, or any other communication device.

The network elements 130 may include, but are not limited to, storage equipment, data processing equipment, and networking equipment. Some networking elements 130 in the smart rack 100 may generate varying levels of heat or moisture that negatively impact the performance of other networking elements 130 in the smart rack 100. In some embodiments of the present invention, the networking elements 130 in each enclosure partition 115 may be configured with intelligent wireless climate sensors that measure, among other things, temperature, moisture, and airflow.

The array of intelligent wireless climate sensors are located either on a surface of the smart rack 100 or on a surface of the network elements 130. The intelligent wireless climate sensors measure, airflow, temperature, moisture, or humidity in the smart rack. The intelligent wireless may be distribute throughout the smart rack in different locations such as, top, bottom, center, left, right, etc. Each intelligent wireless climate sensor is located at a position in the smart rack 100 corresponding to one or more networking elements 130. Further, the intelligent wireless climate sensors continuously measure the climate at the position in the smart rack 100. In an embodiment of the present invention, the intelligent wireless climate sensors may detect relationships between performance of the networking elements 130 and the climate measurements in the smart rack 100.

For instance, in the smart rack 100, a heat envelope is created when cool air accumulates at the bottom and hot air accumulates at the top, or vice versa. The intelligent wireless climate sensors utilize heating relationships in the rack to detect the heat envelopes. The heating relationships are processed to suggest effective redeployment plans for the networking elements 130 within the smart rack 100 to prevent the heat envelopes.

Accordingly, the smart rack 100 utilizes the intelligent wireless climate sensors to provide climate measurements that are processed to relocate network elements 130 that create harmful climate conditions in the smart rack 100. Also, the climate measurements are further processed to generate appropriate notifications on the console 120. One of ordinary skill in the art recognizes an appreciates that the smart rack 100 illustrated by FIG. 1 has been simplified and that alternate configurations fall within the scope of the above description.

The intelligent wireless climate sensors are devices that continuously measure the climate in a smart rack and communicate the measurements, wirelessly, to other intelligent wireless climate sensors that are within a predetermined proximity. The intelligent wireless climate sensors are configured with a rack database that store data associated climate measurements and location data that provides positions for the intelligent wireless climate sensors in the smart rack.

Figure 2:
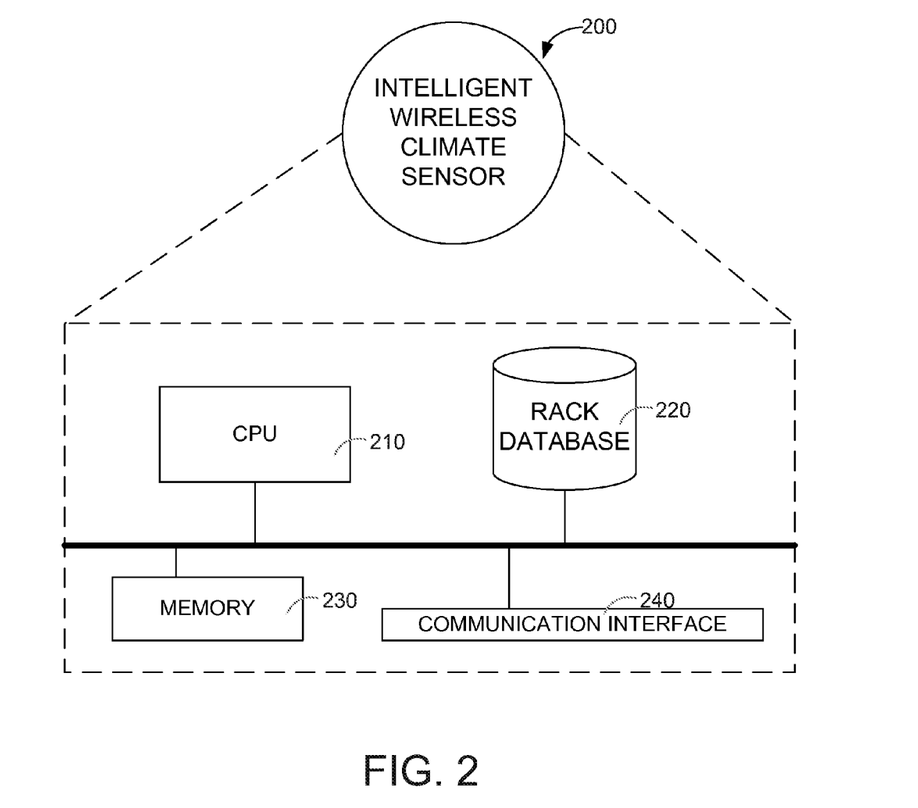
FIG. 2 is a block diagram that illustrates an exemplary intelligent wireless climate sensor, according to embodiments of the present invention.

FIG. 2 is a block diagram that illustrates an exemplary intelligent wireless climate sensor 200, according to embodiments of the present invention. The intelligent wireless climate sensor 200 includes a central processing unit (CPU) 210, a rack database 220, a memory 230, and a communication interface 240.

The CPU 210 executes climate measurement and climate condition detection instructions. The intelligent wireless climate sensor 200 executes climate measurement instructions that measures, among other climate measurements, ambient temperature, humidity, moisture, and air flow, at locations throughout the smart rack. The intelligent wireless climate sensor 200 utilizes the climate measurements to detect when the ambient temperature in the smart rack changes from cool to hot or vice versa. The climate measurements are collected by the intelligent wireless climate sensors 200 at a specified periodic interval—one second, one minute, five minutes or any suitable other period—configured by an user.

The rack database 220 stores the climate measurements for the smart rack and locations for the intelligent wireless climate sensors 200. The CPU 210 utilizes the climate measurements to determine whether a normal notification or alarm notification should be generated based on detected climate conditions in the smart rack. In some embodiments, the rack database 220 also stores configuration information for each intelligent wireless climate sensor 200 within a predefined distance. Table 1 below illustrates an exemplary structure for the rack database 220 of an intelligent wireless sensor 200.

TABLE 1

| DATABASE FIELDS | LOCAL | NEIGHBORING NODES | | | |
|---|---|---|---|---|---|
| Network ID | 1 | 1 | 1 | 1 | 1 |
| Unique ID (e.g. MAC Address, ESN, etc.) | A | B | C | D | E |
| Node Type | Sensor | Sensor | Sensor | Sensor | Console |
| Sensor Location in 3-Dimensions (e.g. x, y, z) | | | | | |
| X | 1 | 1 | 2 | 2 | N/A |
| Y | 1 | 2 | 1 | 2 | N/A |
| Z | 0 | 1 | 0 | 0 | N.A |
| Temperature Thresholds | | | | | |
| Minimum | 50 | 50 | 50 | 50 | N/A |
| Target LOW | 60 | 60 | 60 | 60 | N/A |
| Target HIGH | 80 | 80 | 80 | 80 | N/A |
| Maximum | 95 | 95 | 95 | 95 | N/A |
| Temperature Measured | 70 | 70 | 70 | 70 | N/A |
| HumidityThresholds | | | | | |
| Minimum | 0 | 35 | 35 | 35 | N/A |
| Target LOW | 0 | 0 | 0 | 0 | N/A |
| Target HIGH | 30 | 30 | 30 | 30 | N/A |
| Maximum | 35 | 35 | 35 | 35 | N/A |
| Humidity Measured | 5 | 5 | 5 | 5 | N/A |
| Air Flow Thresholds | | | | | |
| Minimum | 10 | 10 | 10 | 10 | N/A |
| Target LOW | 20 | 20 | 20 | 20 | N/A |
| Target HIGH | 40 | 40 | 40 | 40 | N/A |
| Maximum | 50 | 50 | 50 | 50 | N/A |
| Air Flow Measured (CFM) | 30 | 30 | 30 | 30 | N/A |
| Heat Index (calculated) | 70 | 70 | 70 | 70 | N/A |
| Date | 8/30/2006 | 8/30/2006 | 8/30/2006 | 8/30/2006 | 8/30/2006 |
| Time | 10:27:03 | 10:27:03 | 10:27:03 | 10:27:03 | 10:27:03 |
| Collection Interval | 10 s | 10 s | 10 s | 10 s | |
| Neighbor Update Interval | 10 s | 10 s | 10 s | 10 s | |
| Data Archive Duration (Hours) | 24 | 24 | 24 | 24 | 24 |
| Reporting Address(es) | | | | | |
| Local e.g. rack | 1E | 1E | 1E | 1E | N/A |
| Remote e.g. infra-structure | 10.11.1.3 | 10.11.1.3 | 10.11.1.3 | 10.11.1.3 | 10.11.1.3 |

One of ordinary skill in the art appreciates and understands that the structure of the rack database 220 may be configured to operate as a tree or any other efficient data structure. Each intelligent wireless climate sensor 200 is configured to store, in a local rack database, a position representing the current location of the intelligent wireless climate sensor 200. The position may be stored as a three-dimensional coordinate, such as X, Y, Z. Additionally, each intelligent wireless climate sensor 200 may be configured to store, in the local rack database, coordinates for neighboring intelligent wireless climate sensors that are within a predetermined distance. Accordingly, the intelligent wireless climate sensors 200 may wirelessly communicate with each other to share climate conditions and position information.

For instance, all intelligent wireless climate sensors in a smart rack may be configured with each other's three-dimensional coordinates. Each intelligent wireless climate sensor, in a rack with four intelligent climate sensors—A, B, C, and D—may store, in local rack databases, at least four three-dimensional coordinates. The coordinates may include: a first coordinate that represents the location of the local intelligent wireless climate sensor under consideration, A; a second coordinate represents the location of a first proximate climate sensor, B; a third coordinate represents the location of a second proximate climate sensor, C; and a fourth coordinate represents a third proximate climate sensor, D. Each local rack database may also store the address of a console that displays the normal and alarm notifications. In some embodiments alarm notifications are sent to a local and a remote console.

The location of the neighboring intelligent wireless climate sensors 200 may be uniformly distributed or nonuniformly distributed throughout the smart rack. In a uniform distribution the spacing between intelligent wireless climate sensors 200 is specified as n units, where n is a real number. In a nonuniform distribution the spacing between intelligent wireless climate sensors is allowed to vary. Additionally, the position of the intelligent wireless climate sensors for the smart rack may differ based on the type network elements stored in the smart rack. Some smart racks provide network elements in a horizontal orientation. Other smart racks may provide network elements in a vertical orientation. Furthermore, the intelligent wireless climate sensors 200 are positioned on interior surfaces of the smart rack. In an alternative embodiment of the present invention, the intelligent wireless climate sensors 200 may be positioned on the exterior rack.

The local rack database in each intelligent wireless climate sensor 200 may include identification information about one or more network element. For instance, if an intelligent wireless climate sensor is associated with one or more network elements at a specified location in the smart rack, an identifier, such as an Internet Protocol (IP) address or domain name, for the network elements may be stored in the local rack database.

In some embodiment of the present invention, the intelligent wireless climate sensors 200 collectively report the climate measurements of the smart rack to an external database and an external console. The intelligent wireless climate sensors 200 may include a processor that enables detection of climate measurements that violates a specified climate threshold. The intelligent wireless climate sensors may send the measurements and an indication of the of violation that occurred in the smart rack to the external database. Additionally, each intelligent wireless climate sensor may process a current measurement and measurements received from neighboring climate sensors to calculate an average ambient temperature and heat index in the smart rack. Each intelligent wireless climate sensor 200 may also be equipped to identify the largest and smallest climate measurements among local climate measurements and climate measurement provided by the neighboring intelligent wireless climate sensors.

The memory 230 stores the climate measurement and climate condition detection instructions. The memory 230 transmits the instructions to the CPU 210 when executing the climate measurement and climate detection algorithms. The also stores instruction that enables the intelligent wireless climate sensor 200 to wireless communicate over the communication interface 240.

The communication interface 240 enable wireless communication with intelligent wireless sensors 200 or consoles that are within a predetermined distance. The communication interface 240 may be a Bluetooth interface, a radio frequency interface, or any other suitable wireless communication interface. The communication interface 240 is utilized to transmit location information and climate measurements to other intelligent wireless climate sensors 200.

Accordingly, the intelligent wireless climate sensors are arrayed throughout the smart rack to simultaneously perform climate measurements for multiple locations in the smart rack. The climate measurements may be further processed to detect and store relationships between any subset of the multiple locations in the rack. The detected relationships may be utilized to generate appropriate notifications. Also, the detected relationships are utilized to construct graphical representation of the heat and cool signatures within a specified area of the smart rack. The intelligent wireless climate sensors may include contact or non-contact sensors. In a non-contact orientation the climate measurements are collected without attaching to a specific network element in the smart rack. The non-contact intelligent wireless climate sensors perform climate measurements for regions of space in the rack. Alternatively, in a contact orientation the climate sensors are attached to the network element by a pad or a mounting interface when performing climate measurements.

The intelligent wireless climate sensors are configured to form mesh networks in the smart rack. In the mesh network each intelligent wireless climate sensor communicates with all other intelligent wireless climate sensors. Thus, failure of one of the intelligent wireless climate sensor does not prevent the generation of the appropriate notifications to the console.

Figure 3:
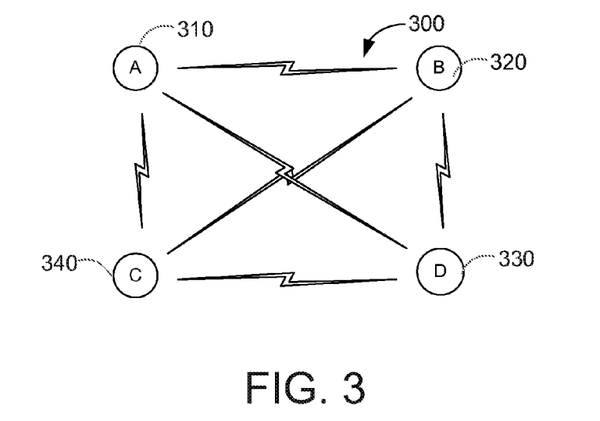
FIG. 3 is a network diagram that illustrates an exemplary mesh network formed by intelligent wireless climate sensors, according to embodiments of the present invention.

FIG. 3 is a network diagram that illustrates an exemplary mesh network 300 formed by intelligent wireless climate sensors 310-340, according to embodiments of the present invention. The mesh network 300 is a fully connected network were each intelligent wireless sensor 310-340 is connected with all neighboring intelligent wireless climate sensors 310-340. Each intelligent wireless 310-340 may perform climate measurements locally or remotely on remote mobile devices or network elements. New intelligent wireless sensors that join the meshed network 300 register with the meshed network 300 to communicate with each intelligent wireless climate sensor 310-340.

Figure 4:
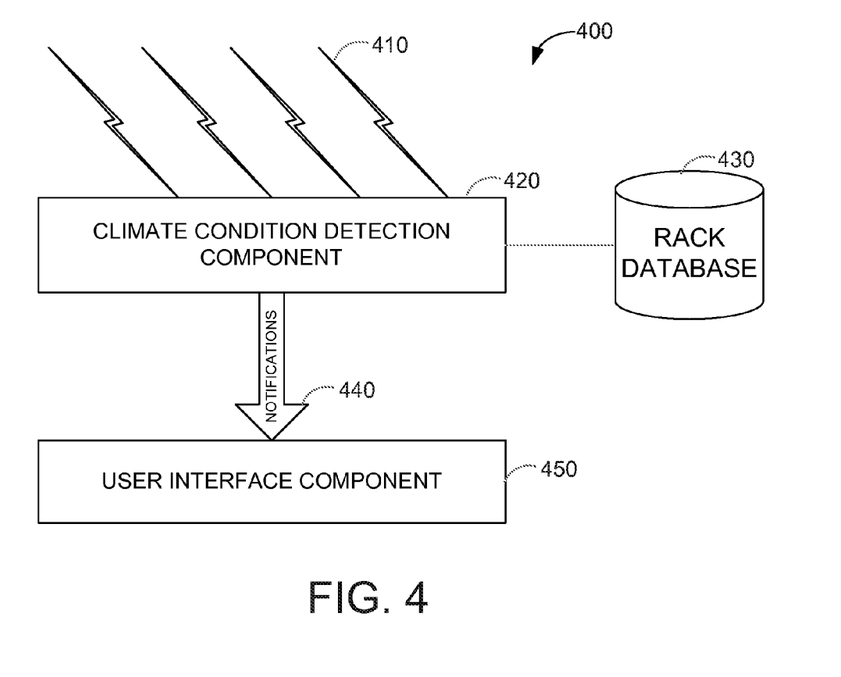
FIG. 4 is a block diagram that illustrates the communications between the climate detection and user interface components, according to embodiments of the present invention.

FIG. 4 is a block diagram that illustrates the communications between the climate detection and user interface components 420 and 450, according to embodiments of the present invention. The graphical presentation component 400 includes a rack database 430, a climate condition detection component 420, and a user interface component 450. The graphical presentation component 400 may be stored locally on each intelligent climate wireless sensor. In an alternate embodiment, the graphical presentation component 400 is stored on a remote mobile device or a remote network element that receives the climate measurements.

The climate condition detection component 420 receives climate measurement form the intelligent wireless climate sensors. The climate detection component 420 compares the thresholds stored in the rack database with the climate measurements received from the intelligent wireless climate sensors. The climate diction component generates the notifications 440 that are sent to the graphical user interface component for further processing. The rack database 430 may be a local database that is stored on each intelligent wireless climate sensor. The rack database 430 may be external to each intelligent wireless climate and may have a structure similar to that of Table described above. The remote rack database 430 may store climate measurements provided by the intelligent wireless climate sensors. Each climate measurement is associated with a three-dimensional location in the smart rack. Also, the climate measurements may be associated with the network elements at a specified three-dimensional location. For instance, for each climate measurement, the remote rack database 430 may store the climate measurement, a three-dimensional location, a type associated with the climate violation, and a type associated with the network element. The remote rack database 430 stores the ambient temperature corresponding to each network element in the smart rack. The ambient temperature information stored in the remote rack database 430 may be utilized to generate notifications, reports, and redeployment plans that provide suggestions on relationships between the network elements in the smart rack. The redeployment plans attempt to reduce ambient temperatures and attempt to prevent the ambient temperature in the rack from passing a specified threshold. Also, the remote rack database 430 may store the airflow levels measured in the smart rack by the intelligent wireless climate sensors. The airflow levels may be utilized to indicate when network elements in the rack restrict the airflow and cause the airflow level to fall below a specified threshold. For instance, the intelligent wireless climate sensors may provide air flow measurements that are processed to detect when a heat envelope is created due to the restricted airflow. After detecting the heat envelope, the climate measurements associated with each network element in the smart rack are further processed to generate redeployment plans that attempt to maintain a specified level of air flow and attempt to prevent the airflow from falling below a specified threshold. Each climate measurement in the remote rack database 430 is associated with a temporal field that stores the interval at which each of the climate measurements are collected. For instance, the temporal field may indicate that the ambient temperature, airflow, moisture, or humidity are measured every thirty seconds. The climate measurements in the remote rack database 430 may provide a collection of all the climate measurements across the smart rack for any period of time. A graphical visual representation may produce a display that indicates how the climate measurements in smart the rack developed during a specified period of time.

The user interface component 450 received the normal notification or alarm notification from the climate condition detection component 420. The user interface provides a graphical visual representation of the normal or alarm notification to a local console or a remote console, whose address is configured in the remote or local rack database. The user interface component 450 may also receive graphical visual representations of network element redeployment plans when an alarm notification is generated by the climate condition detection component 420.

The remote or local console associated with the smart rack provided graphical visual representation of the climate condition in the rack. The graphical visual representations may include textual, color, and icon indicators that are utilized to represent the temperature, humidity, airflow, or any other climate conditions in the smart rack. The remote or local console displays the visual representation generated by the user interface component, which may be located in one or more intelligent wireless sensors or in of the remote or local console.

FIGS. 5-8 are screen shots that illustrate exemplary visual representations of the climate conditions in the smart rack.

The visual representation provide an intuitive indication of the climate conditions in the smart rack that triggered the alarm notifications.

Figure 5:
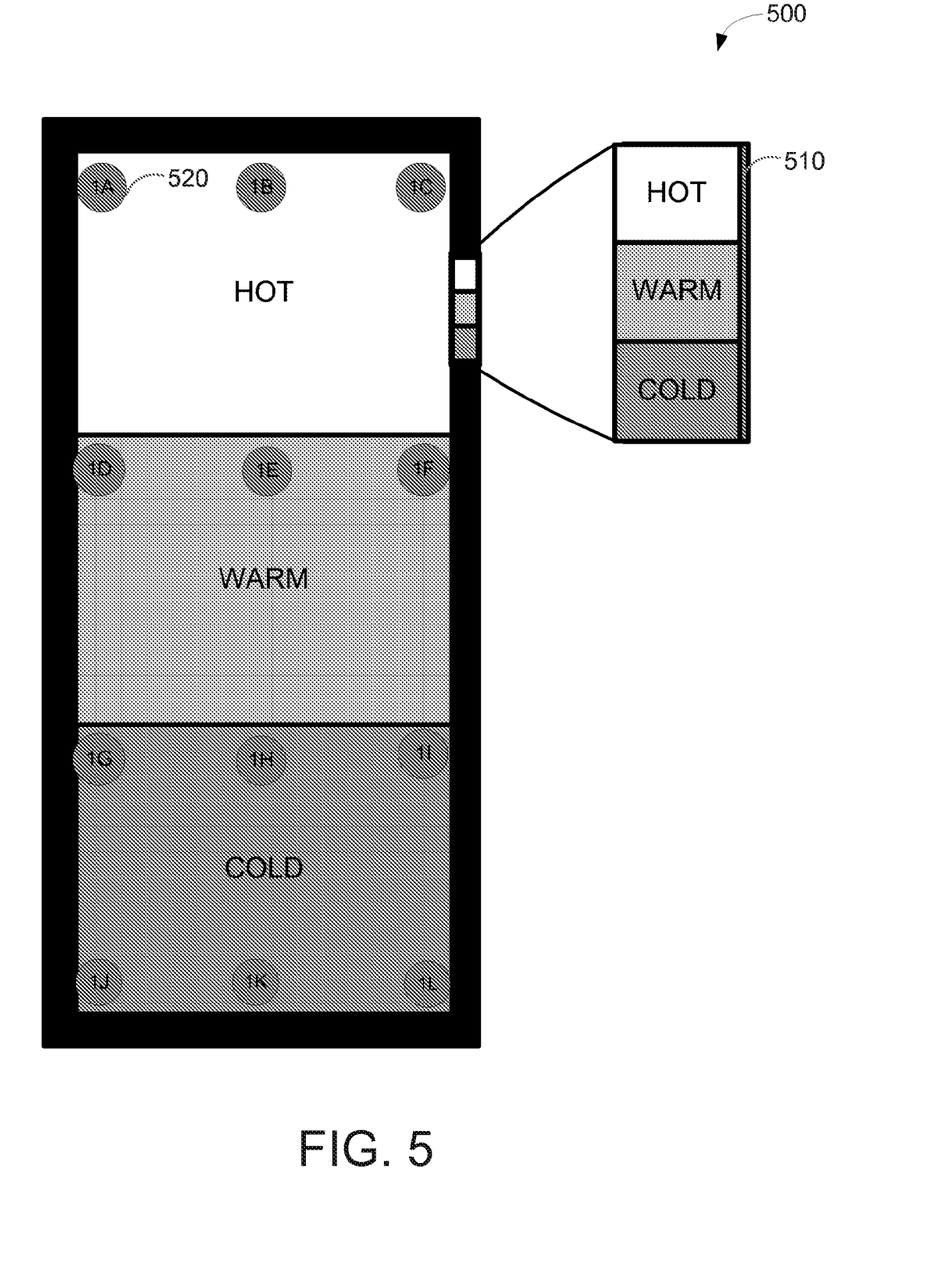
FIG. 5 is a screen shot that illustrates an exemplary climate condition report, according to embodiments of the present invention.

FIG. 5 is a screen shot that illustrates an exemplary climate condition report 500, according to embodiments of the present invention. The climate condition report 500 includes a smart rack section icon 510, a sensor status icon 520 and color and textual indicators that represent smart rack temperatures. The smart rack section icon 510 provides a pictorial summary of sections in the smart rack and a color indicator that is associated with each section. The color indicator represents a temperature measured in the smart rack. For instance, a blue indicator may represent a cold temperature and a red indicator may represent a hot temperature. The sensor status icons 520 provide a pictorial indicator of the location of each of the intelligent wireless climate sensors and an indication the each of the intelligent wireless climate sensors is fully operational. The sensor status icon 520 provides a color indicate to represent a non-operational intelligent wireless climate sensor. For instance, a fully operational intelligent wireless climate sensor may be represented by a green sensor status icon 520.

Figure 6:
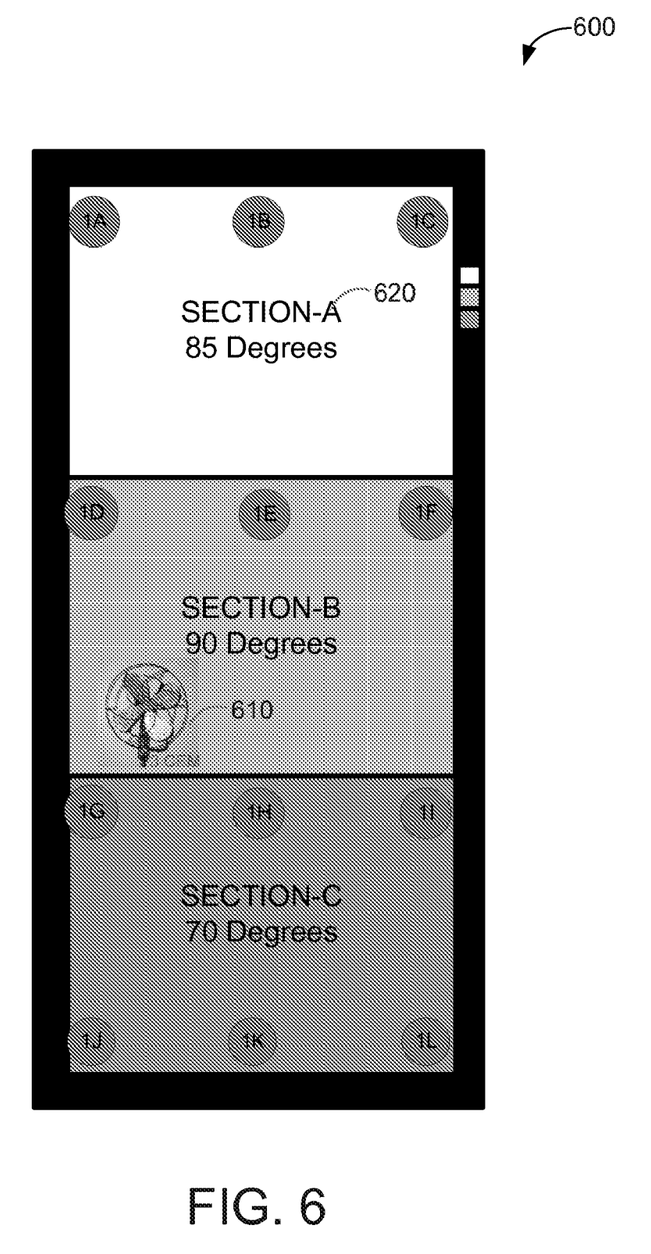
FIG. 6 is a screen shot that illustrates an exemplary climate airflow condition report, according to embodiments of the present invention.

FIG. 6 is a screen shot that illustrates an exemplary climate airflow condition report 600, according to embodiments of the present invention. The climate airflow condition report 600 is very similar to the climate condition report 500. Like the climate condition report 500, the climate airflow condition report 600 includes sensor status icons, smart rack section icons, and color indicators. Further, the climate airflow condition report 600 provides information related to the airflow in the rack. For each section, an airflow icon 610 may be utilized to represent the current level of airflow measured by the intelligent wireless climate sensors located in the section. The climate airflow condition report 600 may also include a section identifier and a textual indicator of the temperature for each section of the smart rack.

Figure 7:
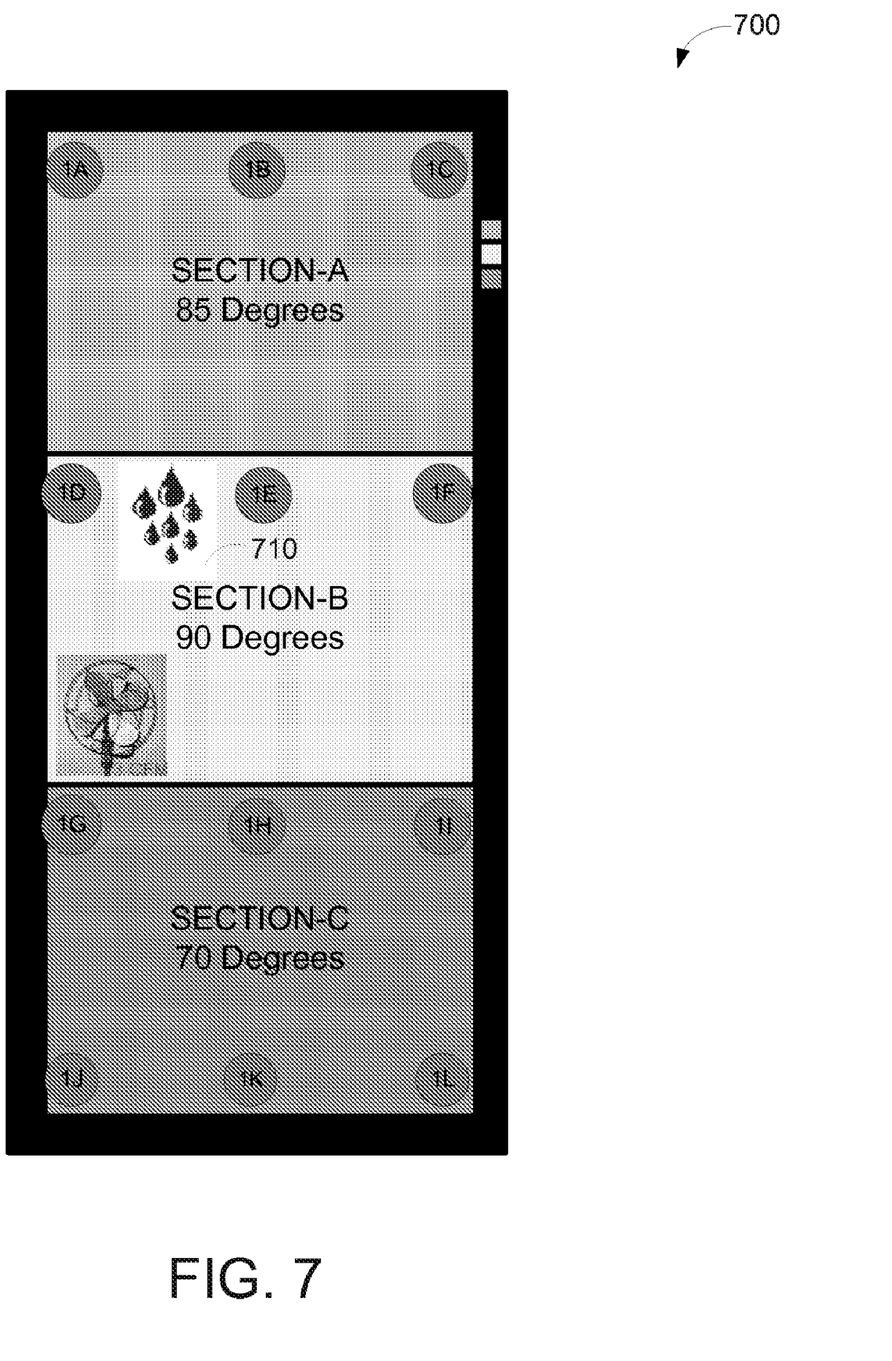
FIG. 7 is a screen shot that illustrates an exemplary climate airflow and humidity condition report, according to embodiments of the present invention.

FIG. 7 is a screen shot that illustrates an exemplary climate airflow and humidity condition report 700, according to embodiments of the present invention. The climate airflow and humidity condition report 700 is very similar to the climate airflow condition report 500. Like the climate airflow condition report 600, the climate airflow and humidity condition report 700 includes sensor status icons, smart rack section icons, airflow icons, and color indicators. Further, the climate airflow and humidity condition report 700 provides information related to the humidity in the rack. For each section, an humidity icon 710 may be utilized to represent the current level of humidity measured by the intelligent wireless climate sensors located in the section. The climate airflow and humidity condition report 700 may also include a section identifier and a textual indicator of the temperature for each section of the smart rack. In some embodiments of the present invention, the climate condition reports are visual representations that aid an administrator or technician with solving climate conditions detected in the rack.

Figure 8:
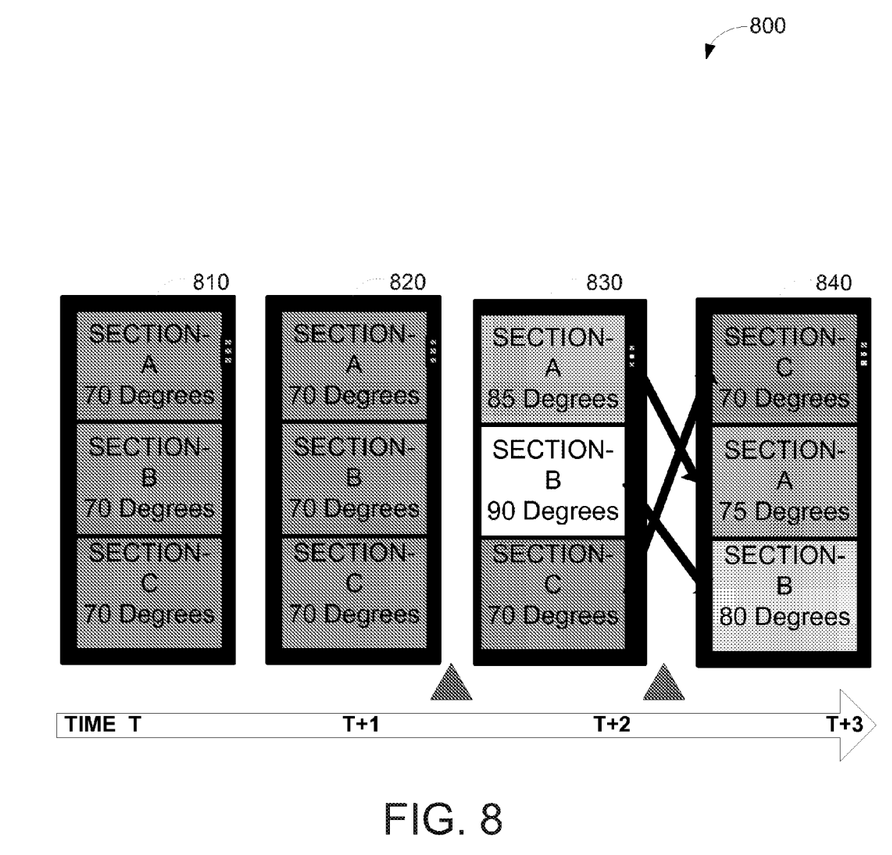
FIG. 8 is a screen shot that illustrates an exemplary historical condition and redeployment plan report, according to embodiments of the present invention.

FIG. 8 is a screen shot that illustrates an exemplary historical condition and redeployment plan report 800, according to embodiments of the present invention. The historical condition and redeployment plan report 800 includes a time line that provides a view of the climate conditions in the smart rack prior to a change in the network element configuration. When the change in smart rack causes a harmful climate condition to occur in the smart rack a redeployment plan is generated to correct the climate condition. For instance, climate condition reports 810-820 provide a historical visual representation of the smart rack between t and t+1. At t+1, a change in the smart rack occurs and soon after the change section B of the smart experience a significant increase in temperature as indicated by climate condition report 830. The climate condition detection component generates an alarm and provides a redeployment plan 840 that corrects the climate condition at t+2 as indicated in climate condition report 840.

Figure 9:
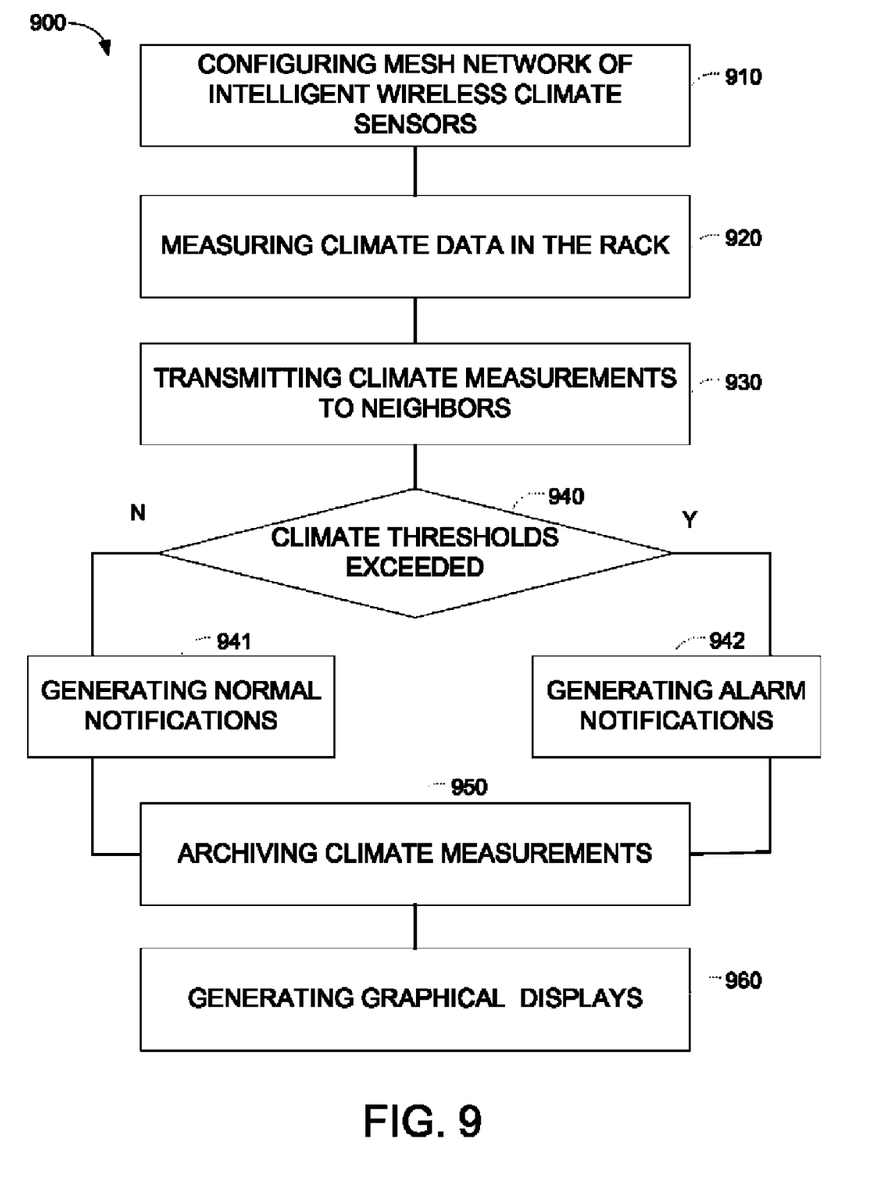
FIG. 9 is a flow diagram that illustrates an exemplary method to identify climate conditions in the smart rack, according to embodiments of the present invention.

FIG. 9 is a flow diagram that illustrates an exemplary method to identify climate conditions in the smart rack, according to embodiments of the present invention. In step 910, a mesh network of intelligent wireless climate sensors in formed in the smart rack. The intelligent wireless climate sensor perform climate measurements in the smart rack, in step 920. In step 930, the climate measurements are transmitted to each neighboring intelligent wireless sensor. In turn, the climate measurements are compare to climate thresholds, in step 940. If the climate measurements exceed the climate thresholds, an alarm notification is generated, in step 942. Otherwise, the a normal notification is generated, in step 941. In step 950, the climate measurements are archived in the rack database. In step 960, an appropriate graphical visual represent is generated and displayed on the console based the normal or alarm notification.

In some embodiments, the smart rack may be updated with new intelligent wireless climate sensors. The new intelligent wireless climate sensors may provide climate measurements for other section in the smart rack.

Figure 10:
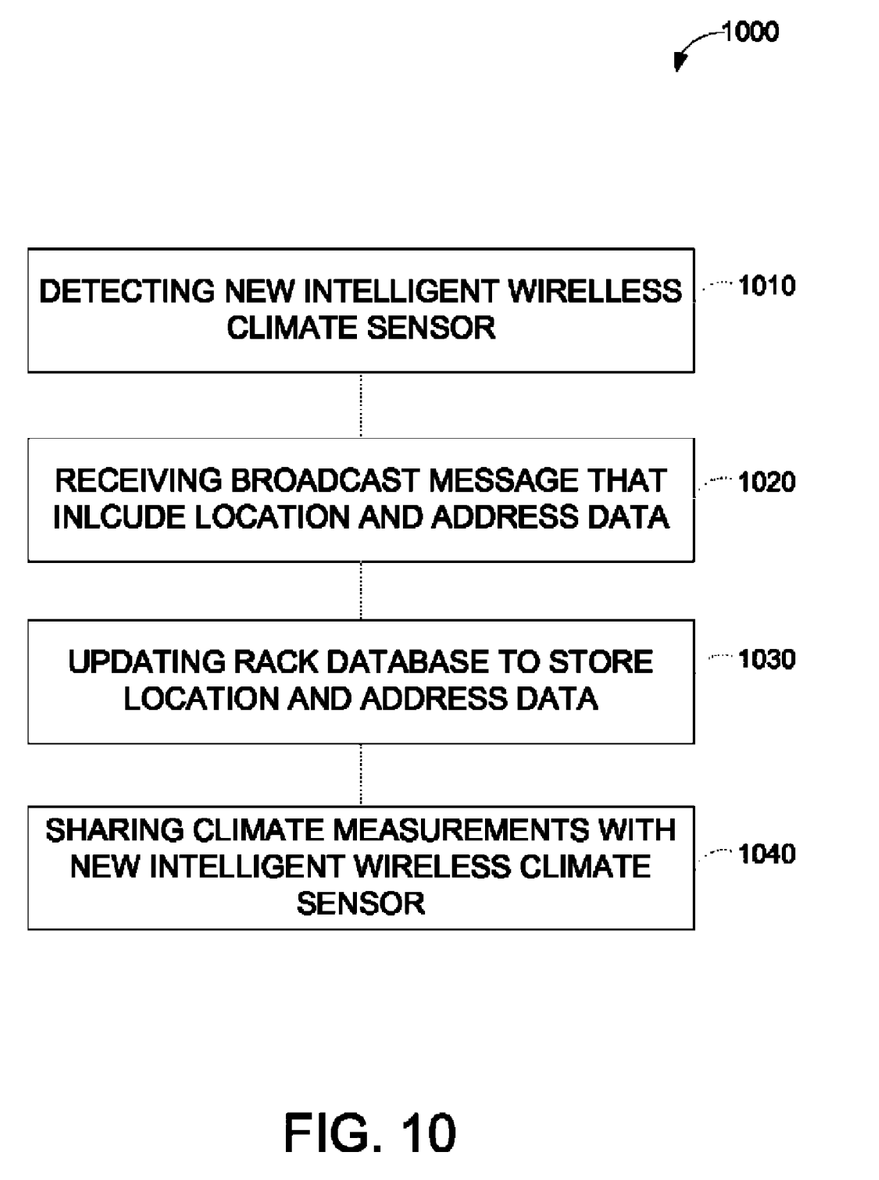
FIG. 10 is a flow diagram that illustrates an exemplary method to add a new intelligent climate sensor to the mesh network, according to embodiments of the present invention.

FIG. 10 is a flow diagram that illustrates an exemplary method to add a new intelligent climate sensor to the mesh network 1000, according to embodiments of the present invention. In step 1010, a new intelligent wireless climate sensor is detected by the mesh network. In step 1020, the mesh network receives a broadcast message that include location and address data for the new intelligent wireless climate sensor. In turn, a remote or local rack database are updated to store the location and address data for the new intelligent wireless climate sensor, in step 1030. In step 1040, the intelligent wireless climate sensors in the mesh network share climate measurements with the new intelligent wireless climate sensor.

Embodiments of the present invention provide smart racks that utilizes arrays of the intelligent wireless climate sensors that form mesh networks to perform climate measurements in the smart rack. The climate measurements are stored in rack database and utilized to generate a user interface. The user interface provides a reporting mechanism that produces a graphical visual representations of the location of the data center and racks contained within the data center. In the visual representation, an colors and icons highlight heat envelopes, areas having moisture, high humidity, or restricted air flow. The colors and icons are a user-friendly and provide intuitive indicators for climate conditions in the rack. In some embodiments, the graphical visual representation may also indicate an elevation—basement, subterranean, sea level, or any suitable elevation—associated with the smart rack. Furthermore, the graphical visual representation provides measurements associated with the ambient temperature, humidity, moisture, or airflow in the rack. In some embodiments of the present invention, both ambient temperature and airflow measurement are utilized to generate redeployment plans for network elements in the smart rack. Additionally, the graphical visual representation may provide a dynamic display that shows the history of the climate conditions within a specified smart rack. For instance, graphical snapshots may provide data related to climate conditions during subsequent periodic intervals. The snapshot may includes frames that display changes in climate conditions at a specified rate, such as for example 30 frames per minute. Also, the visual representation may reproduce the climate conditions to illustrate changes that occur at periodic intervals in the smart rack. The graphical visual representation may represents airflow currents and formation of heat envelopes within the rack.

Moreover, the graphical visual representations may provide details associated with neighboring smart racks. The visual representation may illustrate a relationship between neighboring smart racks. For instance, a smart rack having a heat envelope may be bleeding into a neighboring smart rack. The graphical visual representation may simultaneously display climate conditions associated with neighboring smart racks of a smart rack under consideration to determine whether changes in the neighboring smart racks impact the smart rack under consideration.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

The invention claimed is:

1. One or more non-transitory tangible computer-readable media having computer-useable instructions embodied thereon for performing a method to identify climate conditions in a rack having network elements utilizing wireless climate sensors, the method comprising:
   receiving climate measurements for the rack from the wireless climate sensors;
   storing the climate measurements in a rack database; and
   processing the climate measurements to determine whether the climate measurements are within a specified range,
   (1) if the climate measurement is outside the specified range, generating an alarm notification that graphically indicates the climate measurements are outside of the specified range and displaying redeployment plans for network elements within the rack, and
   (2) if the climate measurement is within the specified range, generating a normal notification that graphically indicates the climate measurements is within the specified range.

2. The media of claim 1, wherein the rack database stores position information associated with each wireless climate sensor within a predetermined radius.

3. The media of claim 1, wherein the climate measurements are updated at a periodic interval.

4. The media of claim 1, wherein the alarm notification and normal notification are displayed on at least one of an enclosure for the rack or a mobile device.

5. The media of claim 1, wherein the alarm notification includes a suggestion, which provides corrective action that adjust the climate measurement to a level that is within the specified range.

6. The media of claim 5, wherein the suggestion is graphically presented.

7. An apparatus comprising one or more racks having an array of wireless climate sensors for detecting climate conditions associated with network elements in the rack, each rack comprising:
   a plurality of sections that include a subset of the network elements and a subset of the array of wireless climate sensors;
   a console interface configured to display climate conditions associated with the plurality of sections in the rack, wherein the wireless climate sensors for each section of the plurality of sections communicates a climate condition to the console interface; and
   an enclosure having one or more partitions for the plurality of sections and a mounting mechanism that secures the console interface, which displays a graphical visual presentation of the climate condition over a specified period of time and redeployment plans for network elements within the one or more racks.

8. The apparatus of claim 7, wherein each wireless climate sensor located in each section of the plurality of sections is assigned a three-dimensional coordinate.

9. The apparatus of claim 7, wherein each wireless climate sensor is mounted to at lest one of a surface of the enclosure or a surface of a network element.

10. The apparatus of claim 7, wherein the climate condition is at least one of temperature, humidity, and airflow.

11. The apparatus of claim 7, wherein the console interface graphically represents the climate condition associated with each section of the plurality of sections.

12. The apparatus of claim 11, wherein the console interface graphically represents the climate condition using one or more colors.

13. The apparatus of claim 11, wherein the console interface graphically represents the climate condition utilizing a specified set of icons.

14. An apparatus comprising one or more intelligent wireless climate sensors for detecting climate conditions in a rack having network elements, each climate sensor comprising:
   a memory to store the climate measurement and climate condition detection instructions;
   a central processing unit (CPU) to execute climate measurement and detection instructions stored in the memory;
   a rack database to log climate measurements in the rack and to store thresholds associated with predetermined climate conditions; and
   a communication interface to wirelessly transmit climate measurements to neighboring sensors within a predetermined radius a display device that provides climate conditions received from the communication interface that is connected to the display device, wherein the display device is integrated into the console of the rack or provided by a mobile device configured to display redeployment plans for network elements within the rack.

15. The apparatus of claim 14, wherein the CPU generates a report of the climate conditions detected in the rack.

16. The apparatus of claim 14, wherein the rack database stores the climate measurements provided by the neighboring sensors.

17. The apparatus of claim 14, wherein the communication interface connects neighboring sensors to form a mesh network.

* * * * *